United States Patent [19]
Dekker

[11] Patent Number: 5,598,126
[45] Date of Patent: Jan. 28, 1997

[54] METHOD AND ARRANGEMENT FOR CONTROLLING THE OPERATION OF A HIGH-FREQUENCY POWER AMPLIFIER

[75] Inventor: André P. Dekker, Oulu, Finland

[73] Assignee: Nokia Telecommunications Oy, Espoo, Finland

[21] Appl. No.: 454,269
[22] PCT Filed: Sep. 22, 1994
[86] PCT No.: PCT/FI94/00425
 § 371 Date: May 23, 1995
 § 102(e) Date: May 23, 1995
[87] PCT Pub. No.: WO95/08866
 PCT Pub. Date: Mar. 30, 1995

[30] Foreign Application Priority Data

Sep. 23, 1993 [FI] Finland ................................. 934168

[51] Int. Cl.$^6$ ............................................ H03G 3/20
[52] U.S. Cl. ..................... 330/129; 330/144; 330/279; 330/284; 455/126
[58] Field of Search ..................... 330/129, 141, 330/144, 145, 279, 281, 284; 455/116, 126

[56] References Cited

U.S. PATENT DOCUMENTS 5,054,116 10/1991 Davidson ................. 455/126
5,128,629 7/1992 Trinh .

FOREIGN PATENT DOCUMENTS 397443 11/1990 European Pat. Off. .
0481524 4/1992 European Pat. Off. .
546693 11/1992 European Pat. Off. .
WP91/12661 8/1991 WIPO .

*Primary Examiner*—James B. Mullins
*Attorney, Agent, or Firm*—Cushman Darby & Cushman IP Group of Pillsbury Madison & Sutro LLP

[57] ABSTRACT

An arrangement for controlling a high-frequency power amplifier, including a high-frequency power amplifier, a feedback line between the input side and the output side of the high-frequency power amplifier, a control connected to the input side of the high-frequency power amplifier and communicating with the feedback line, a sampler and a detector connected to the feedback line between the output side and the input side of the high-frequency power amplifier, as well as a switch connected to the forward line for bringing the high-frequency power amplifier to an OFF state controlled by a control signal. A parallel loop provided with a reference voltage feed is connected to the feedback line. The loop includes a signal adapter, the transfer function of which is dimensioned to substantially correspond to the transfer function of a power control loop constituted by the forward line and the feedback line, measured at switching points of the parallel loop.

11 Claims, 2 Drawing Sheets

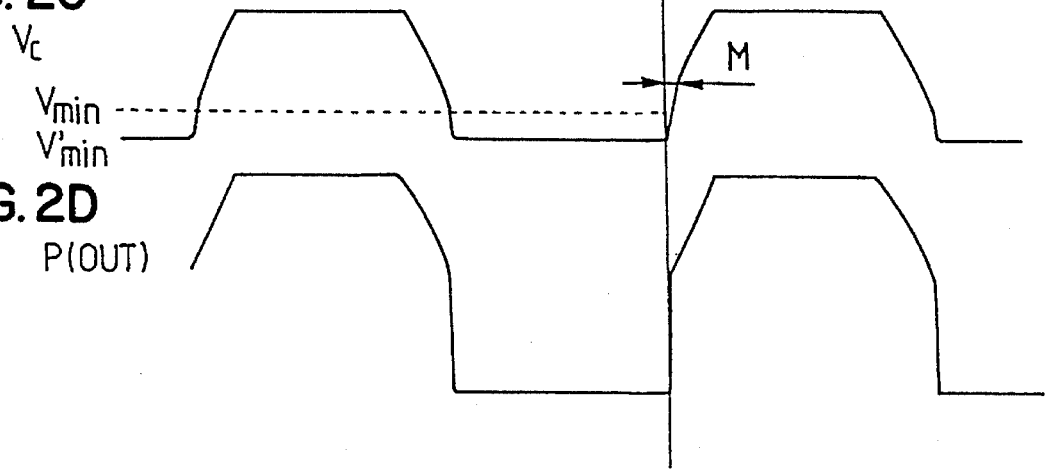
FIG. 2A S1
FIG. 2B S2
FIG. 2C $V_C$
FIG. 2D P(OUT)
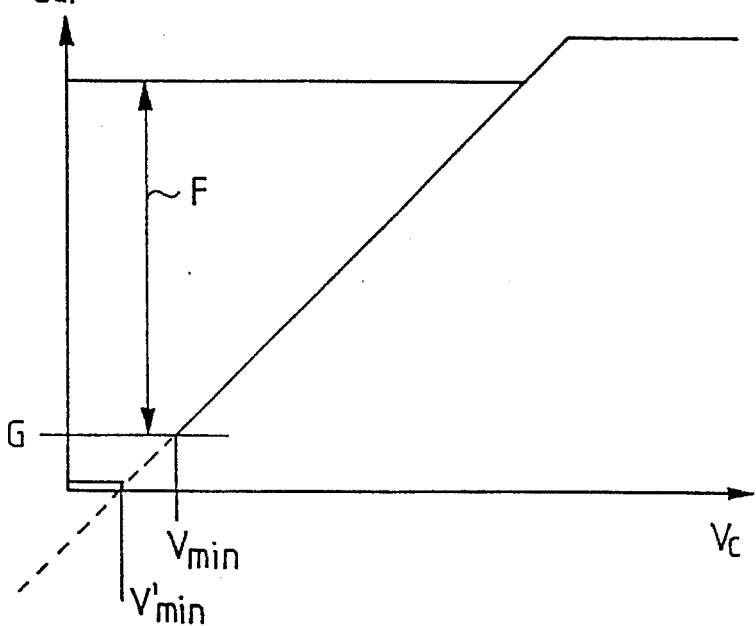
FIG. 3

METHOD AND ARRANGEMENT FOR CONTROLLING THE OPERATION OF A HIGH-FREQUENCY POWER AMPLIFIER

BACKGROUND OF THE INVENTION

The invention relates to a method and an arrangement for controlling the operation of a high-frequency power amplifier.

In GSM transmitters, for instance, specifications place rigid restrictions also on the operation of the transmitter as well as on switching on and off the transmission power. At power control and especially at switching off and reswitching the power, strict limit values shall be observed, particularly as far as the range of variations in power levels is concerned. When transmission power is switched off at a GSM transmission according to the specifications, it should be possible to reduce the transmission power during idle time slots between frames by at least 70 dB, in practice however by 80 dB, which can be carried out by decreased gain and by using RF range switching means providing an attenuation of about 40 dB, in addition to the 40 dB obtained by the control of the amplifier. One problem with the previous solutions is that the dynamic range of detector means is only about 40 dB.

In some methods and arrangements according to the prior art, the transmission power is switched off by using a switching means positioned in a power switching loop on the input side of an amplifier, in which case the signal path breaks, however, and the detector output remains floating in a way. This generates a control signal undefined in its details in a control means of the input side of the amplifier, which in turn causes problems, i.e. practically a control error in a situation when the transmission power shall be switched on again. A control error may also cause a decrease in attenuation when the power is switched off. This restricts the permitted maximum gain between the detector and the control means as well, which maximum gain determines in turn the accuracy of the output power in an ON state. Some known solutions are disclosed in European Patent Applications 0 481 524, 0 546 693 and 0 397 444, U.S. Pat. No. 5,128,629 and WO 91/12661.

SUMMARY OF THE INVENTION

The method comprises inputting a signal to be amplified to a high-frequency power amplifier in a forward line, generating a sample signal from the forward line on the output side of the high-frequency power amplifier to a feedback line, detecting the sample signal by a detector means, controlling the high-frequency power amplifier via the feedback line by a control means connected to the input side of the high-frequency power amplifier from a gain state to an OFF state by switching off the signal of the forward line and bringing the high-frequency power amplifier from the OFF state back to the gain state by switching on the signal of the forward line.

The arrangement according to the invention comprises a high-frequency power amplifier connected to a forward line and having an input side and an output side, a feedback line between the input side and the output side of the high-frequency power amplifier, a control means connected to the input side of the high-frequency power amplifier and communicating with the feedback line, a sampling means and a detector means connected to the feedback line between the output side and the input side of the high-frequency power amplifier as well as a switching means connected to the forward line for bringing the high-frequency power amplifier to an OFF state controlled by a control signal.

The present solution relates especially to multichannel radio transmitters and how to switch on the transmission power of a high-frequency power amplifier of a radio transmitter and particularly how to switch off the transmission power, i.e., how to bring it to an OFF state. One example of radio transmitters is a base station radio transmitter of a GSM mobile telephone network utilizing a TDMA system, the high-frequency power amplifier of which radio transmitter amplifies the signals to be received from a modulator before these are inputted to an antenna.

The object of this invention is to set forth a novel method and arrangement for controlling the operation of a high-frequency power amplifier, which avoid the problems associated with the known solutions.

This object is achieved by means of the method according to the invention, which is characterized in that, at a transition to the OFF state, in addition to the signal of the forward line being switched off, a signal adapter communicating with a reference voltage is connected by means of one or several switching means in parallel with the feedback line, to the input side of which adapter is fed a control voltage of the control means and that the feedback line is supplied with the output of the signal adapter at a point after the detection of the sample signal.

The arrangement according to the invention is characterized in that a parallel loop provided with a reference voltage feed is connected to the feedback line, which loop comprises a signal adapter, the transfer function of which is dimensioned to correspond essentially to the transfer function of a power control loop constituted by the forward line and the feedback line, measured at switching points of the parallel loop.

The method and the arrangement according to the invention are based on the idea that, with the transmitter and the high-frequency power amplifier in an OFF state, the extra switching loop, positioned in parallel with the actual feedback line, may keep the power switching loop, i.e. the power control loop in a state of readiness for reswitching the power.

Several advantages are achieved by means of the solution of the invention, since the control means positioned on the input side of the high-frequency power amplifier and controlled via the feedback line, e.g. a voltage-controlled attenuator (VCA), does not react to switching off the transmission power in a detrimental manner in the method and switching arrangement according to the invention, which caused control error in the previous solutions, especially when the power was increased and switched on. In the solution of the invention, the properties of the high-frequency power amplifier are better than in the known solutions, both during gain and when switching off or on the power. The solution of the invention provides a narrower frequency spectrum, the spectrum peaks of which are not too deviating, and therefore, the solution according to the invention makes it possible to switch on and off the power in a manner according to the specifications better than previously.

BRIEF DESCRIPTION OF THE DRAWINGS

In the following, the invention will be described in more detail referring to the attached drawings, in which FIGS. 2A–2D show, plotted for the same interval, elements of a timing diagram for the arrangement, and FIG. 3 shows an output voltage of a detector as a function of an input voltage of a control means.

DETAILED DESCRIPTION

Figure 1:
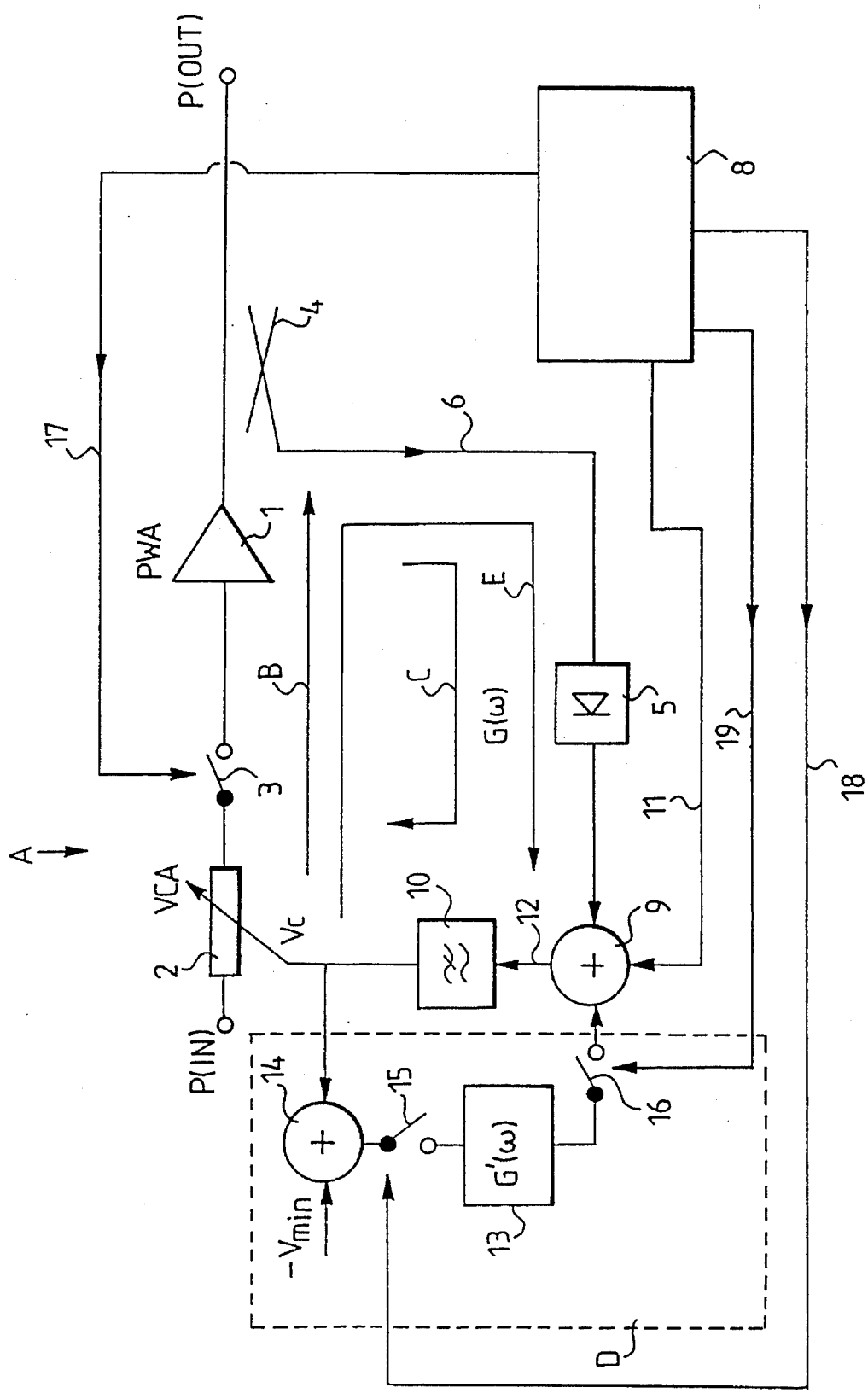
FIG. 1 shows a block diagram of an arrangement according to the invention.

The arrangement of FIG. 1 comprises a power switching loop, i.e. a power control loop A, constituted by a forward line B and a feedback line C. The arrangement comprises a high-frequency power amplifier 1 connected to the forward line B, a control means 2 connected to the input side of the high-frequency power amplifier 1 and a switching means 3 for bringing the high-frequency power amplifier to an OFF state. The control means 2 may be realized by means of a voltage-controlled attenuator (VCA), for instance, and the switching means 3 may, in turn, be realized, for example by means of an RF switch, by which is achieved an attenuation of 40 dB, for example. Indication P(IN) represents the input side of the power switching loop, to which input a signal to be amplified comes from a modulator of a transmitter, and indication P(OUT) represents an antenna line starting from the output side of the amplifier. In addition, the arrangement comprises a sampling means 4 and a detector means 5 connected to the feedback line C between the output side and the input side of the amplifier. The sampling means 4 may preferably be constituted by a directional coupler, such as a microstrip directional coupler, which generates, from an output signal of the amplifier, a sample signal 6 proportional to the strength of the output signal. The sample signal 6 is detected by the detector means 5, which may be constituted by a rectifier implemented by means of diodes, for instance. Still referring to FIG. 1, the arrangement also comprises a control unit 8, a summer 9 and a low-pass filter 10.

The switching means 3 not breaking the signal path may be connected alternatively in front of the control means 2, in which case the control means 2 and the switching means 3 would be in opposite order in FIG. 1.

The method for controlling the operation of a high-frequency power amplifier comprises inputting a signal to be amplified to a high-frequency power amplifier 1 in a forward line B, generating a sample signal from the forward line B on the output side of the high-frequency power amplifier 1 to a feedback line C by a sampling means 4. The method further comprises detecting the sample signal by a detector means 5, summing the detected sample signal to a reference signal 11 to be received from a control unit 8, low-pass filtering the summation signal 12 by a low-pass filter 10 and gain, if necessary, controlling the gain of the high-frequency power amplifier 1 on the basis of the detected, summed and filtered sample signal by a control means 2 connected to the input side of the high-frequency power amplifier. The method conforms to the above in a normal situation, i.e. when the power switching loop A is active and amplifies the incoming signal.

In addition to the facts presented, the arrangement comprises a parallel loop D connected to the feedback line C and comprising a signal adapter 13, the transfer function $G^-(\omega)$ of which is dimensioned to correspond essentially to the transfer function $G(\omega)$ of the power switching loop A constituted by the forward line B and the feedback line C, measured at switching points of the parallel loop D. Arrow E shows the distance between the switching points, from which distance the transfer function $G(\omega)$ of the actual power switching loop is measured. The signal adapter 13 may be an amplifier or a filter, for example.

FIG. 3 shows a detector output voltage Vdet as a function of an input voltage Vc of the control means 2. In FIG. 3, arrow F shows the dynamic range of the detector 5, at the edge of which range, in this case at the lower limit, the input voltage Vc of the control means 2 receives the value Vmin. From FIG. 3 is seen that the input voltage Vc of the control means 2 changes linearly in proportion to the output voltage Vdet of the detector 5. The signal adapter 13 is provided with a reference voltage feed $-V$ min, which is essentially of the same order of magnitude as or smaller than the input voltage Vc of the control means 2, measured in a situation (Vc=Vmin) when the detector means 5 is at the edge of its dynamic range, i.e. at the lower limit G. The arrangement also comprises a second summer 14, through which a summation signal of the reference voltage $-V$ min and the voltage Vc, or actually a difference signal, is inputted to the signal adapter 13. In a preferred embodiment, both the input side and the output side of the signal adapter 13 are arranged to be switched off from the feedback line C by means of switching means 15 and 16. The switching means 15 of the input side of the signal adapter 13 effects that, when the switching means 3 starts switching off the power, the output of the signal adapter 13 is zero, and accordingly, switching on the switching means 16 does not cause any disturbance in the power control loop. Moreover, the signal adapter 13 cannot be overloaded in a normal situation. Correspondingly, the switching means 16 of the output side of the signal adapter 13 effects that in a normal situation, i.e. when the high-frequency power amplifier is active with the switch 3 on, the signal adapter 13, e.g. an amplifier, does not disturb the operation of the actual feedback line C. From FIG. 1 is seen that the signal adapter 13 is connected in parallel with a filter means 10 contained in the feedback line C, thus preferably via the two switching means 15 and 16 and the two summers 9 and 14.

When the power is switched off, the method also comprises bringing the high-frequency power amplifier 1 to an OFF state by a control signal 17 generated in the control unit 8. The high-frequency power amplifier is brought to the OFF state by controlling the switching means 3 by the control signal 17.

The method comprises bringing the high-frequency power amplifier 1 from a gain state to an OFF state by switching off the signal of the forward line by the switching means 3 and bringing the high-frequency power amplifier from the OFF state back to the gain state by switching on the signal of the forward line by the switching means 3. At a transition to the OFF state, in addition to the signal of the forward line being switched off, a signal adapter 13 is connected in parallel with the feedback line C by means of one or several switching means 15, 16, to the input side of which adapter are fed a reference voltage $V^-$min and a control voltage Vc of the control means 2, and moreover, the feedback line D is supplied with the output of the signal adapter 13 at a point after the detection of the sample signal, for instance in the summer 9. The switching means 15 and 16 of the parallel loop D are controlled by control signals 18 and 19, whereby the switches 15 and 16 are closed when the switch 3 is opened.

In a preferred embodiment, the switch 3 of the forward line B is opened and the switches 15 and 16 of the parallel loop D of the feedback line C are closed by the common control unit 8 according to FIG. 1, and expressly by the same control unit 8 which inputs the reference signal, i.e. control signal 11, to the summer 9, through which is achieved a solution which is structurally the simplest and the easiest to implement. FIGS. 2A–2D show a timing diagram for various signals. The uppermost signal S1 (FIG. 2A) represents the reference signal, i.e. the control signal 11 from the control unit 8 to the summer 9. The second uppermost signal S2 (FIG. 2B) represents the control signal 17 for the switching means 3 preceding the high-frequency power amplifier 1. The third uppermost signal (FIG. 2C) represents the input voltage Vc of the control means 2. The lowest signal (FIG. 2D) represents the outgoing power P(OUT). As to the signal S2, the levels of the signal S2 for the control signals 18 and 19 are opposite to those for the control signal 17.

In a preferred embodiment, before the signal of the forward line B is switched off, the gain is attenuated at least approximately to the edge G of the dynamic range of the detector means 5, in which case switching off the power will be a two-phase measure. The attenuation is provided by a falling portion S11 of the reference signal 11, i.e. the control signal S1, whereby the control means 2 attenuates the gain. Switching off the power continues, and then, when the signal S2 is at a falling edge S22, the switching means 3 is opened by the control signal 17 and, in the same connection, the switching means 15 and 16 of the parallel loop D are closed by the control signals 18 and 19. From the lowest signal appears a two-phase switching off of power. From the third uppermost signal Vc also appears a voltage drop of the control means, at first to a value Vmin and then further to a value V$^-$min. The parallel loop D and the reference voltage feed –V$^-$min make it possible that the input voltage of the control means 2 remains in the vicinity of the value Vmin and even at its lowest still at the value V$^-$min. After the switch 3 has switched off the signal of the forward line B, the signal is below the edge G of the dynamic range F of the detector 5.

The power P(OUT) remains low as long as the control signal 17, i.e. S2, is low. With the power switched off, an amount of reference voltage –V$^-$min is fed to the signal adapter 13, this amount corresponding essentially to the amount of voltage (Vmin) going into the control means 2, measured in a situation when the detector means is at least approximately at the edge G of its dynamic range, i.e. at the lower limit.

At a rising edge S23 of the signal S2, the positions of the switching means 3, 15 and 16 are turned, whereby the switching means 3 is closed and the switching means 15 and 16 are opened, accordingly. At a transition from an OFF state to a gain state, the signal adapter 13 is thus switched off from the feedback line C and the signal of the forward line B is switched on. The outgoing power P(OUT) then rises by the value of the attenuation of the switching means 3.

In one embodiment, an amount of reference voltage is fed to the signal adapter 13, which amount is smaller than the amount of voltage going into the control means 2, measured in a situation when the detector means is at least approximately at the edge G of its dynamic range. This makes a lower output power in an OFF state and a power raise at an initial stage possible, but at a transition from the OFF state to a gain state after the signal of the forward line B has been switched on and the signal adapter 13 has been switched off from the feedback line C, the gain P(OUT) rises with a short delay M during a rising portion S12 of the signal S1 by means of the control means 2 connected to the input side of the high-frequency power amplifier 1 towards its final higher value. During the delay M, the power control loop is open in a way, and therefore, the reference signal 11 should not be allowed to rise too strongly upwards. In FIGS. 2A–2D, the purpose of the vertical line N is only to illustrate the existence of the delay M.

At a transition from an OFF state to a gain state, the procedure in the most preferred embodiment is that the reference signal 11, i.e. the reference voltage S1, is raised immediately after the change of state of the switches 3, 15 and 16, due to which the power control loop operates as accurately as possible.

Though the invention has been described above referring to the examples of the attached drawings, it is clear that the invention is not restricted to those, but it can be modified in many ways within the scope of the inventive idea set forth in the attached claims.

I claim:

1. A method for controlling operation of a high-frequency power amplifier, comprising the steps of:

(a) inputting a signal to be amplified to a high-frequency power amplifier via a forward line;

(b) generating a sample signal from said forward line on an output side of said high-frequency power amplifier, to a feedback line;

(c) detecting the sample signal at a first point in said feedback line, using a detector having a dynamic range;

(d) controlling said high-frequency power amplifier via said feedback line, using a controller connected to an input side of said high-frequency power amplifier;

(e) bringing said high-frequency power amplifier from a gain state, to an OFF state, by switching off said signal from being inputted to said high-frequency amplifier via said forward line;

(f) bringing said high-frequency power amplifier from said OFF state back to said gain state, by switching on said signal to being inputted to said high-frequency amplifier via said forward line;

(g) coinciding with step (e), using at least one switch for both communicating a reference voltage to a signal adapter, and connecting the signal adapter in a parallel loop in parallel with a portion of said feedback line and thereby supplying a control voltage from said feedback line at a second point to said signal adapter as input, and supplying said feedback line with an output of said signal adapter at a third point which is located functionally between said first and second points.

2. The method of claim 1, further comprising:

prior to conducting step (e), attenuating gain of said signal as provided by said amplifier in said forward line, at least approximately to an edge of said dynamic range of said detector.

3. The method of claim 1, further comprising:

coinciding with step (f), using said at least one switch for effectively disconnecting said signal adapter from feedback line.

4. The method of claim 3, further comprising:

while conducting step (f), at a time substantially immediately after switching on said signal and disconnecting said signal adapter, increasing gain provided by said amplifier in said forward line, using said controller, to a higher value.

5. The method of claim 3, further comprising:

using a control unit for providing said feedback line with a reference signal effectively at said third point, and for operating said at least one switch for connecting and disconnecting said signal adapter to and from said portion of said feedback line.

6. The method of claim 1, wherein:

said reference voltage substantially corresponds to said control voltage as supplied via said feedback line to said controller, as measured at a time when said detector is approximately at an edge of said dynamic range thereof.

7. The method of claim 1, wherein:

said reference voltage is smaller than said control voltage as supplied via said feedback line to said controller, as measured at a time when said detector is approximately at an edge of said dynamic range thereof.

8. The method of claim 1, further comprising:

low pass filtering voltage in said feedback line, between said third and second points.

9. An arrangement for controlling a high-frequency power amplifier, comprising:

- a high-frequency power amplifier provided in a forward line and having an input side and an output side;
- a feedback line functionally provided for said forward line, between the output side and the input side of said amplifier;
- a control means functionally connected to the input side of said amplifier and communicating with said feedback line;
- a sampler serving as input to said feedback line from said forward line;
- a detector connected to said feedback line between said output side and said input side of said amplifier;
- a switching means connected to the forward line for switching the amplifier between an OFF state and a gain state;
- a control unit operable for providing a control signal for operating said switching means for switching said amplifier;
- a parallel loop disconnectably connected in parallel with a portion of said feedback line and to be provided with a reference voltage feed;
- a signal adapter provided in said parallel loop, said signal adapter having a transfer function which substantially corresponds to the transfer function of a power control loop constituted by said forward line and said feedback line, measured where said parallel loop connects with said portion of said feedback line.

10. The arrangement of claim 9, wherein:

said parallel loop is caused to be disconnectably connected in parallel with a portion of said feedback line, by including one switch between an output side of said signal adapter and said feedback line, and another switch between an input side of said signal adapter and said feedback line.

11. The arrangement of claim 10, further including:

a filter provided in said feedback line effectively between said one and other switches.

\* \* \* \* \*